Figure 1:
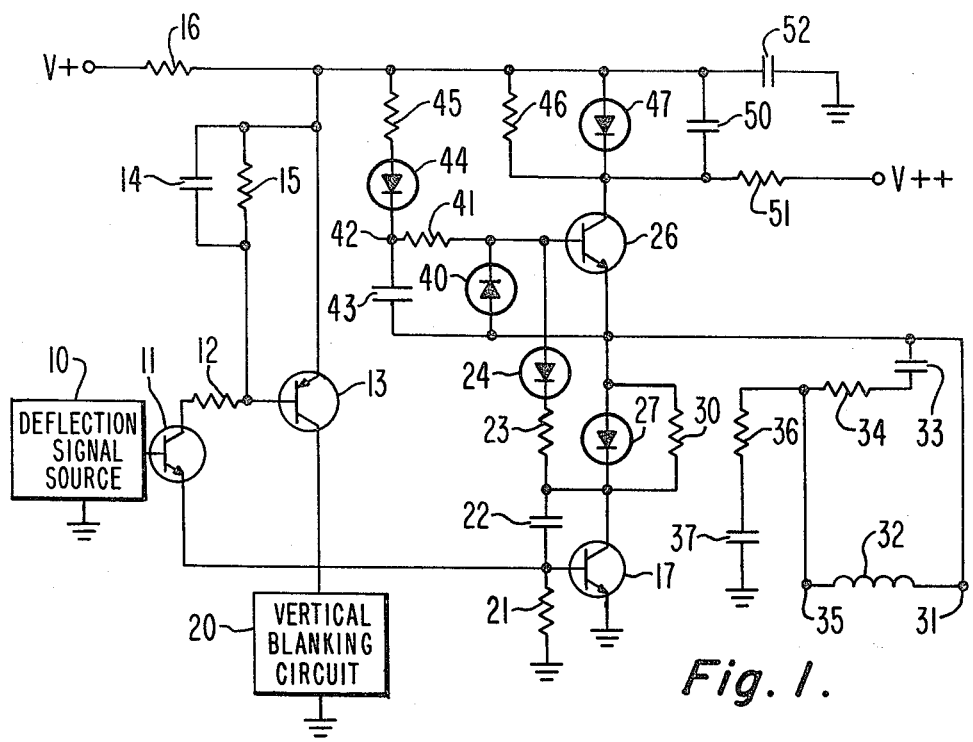

United States Patent [19]

Fitzgerald

[11] 4,293,803
[45] Oct. 6, 1981

[54] VERTICAL DEFLECTION CIRCUIT
[75] Inventor: William V. Fitzgerald, Indianapolis, Ind.
[73] Assignee: RCA Corporation, New York, N.Y.
[21] Appl. No.: 118,120
[22] Filed: Feb. 4, 1980
[51] Int. Cl.³ .............................................. H01J 29/70
[52] U.S. Cl. .................................... 315/397; 315/403
[58] Field of Search ................ 315/396, 403, 395, 397

[56] References Cited

U.S. PATENT DOCUMENTS

| | | | |
|---|---|---|---|
| 3,111,603 | 11/1963 | Marshall, Jr. et al. | 315/403 |
| 3,727,096 | 4/1973 | Wilcox | 315/395 |
| 3,784,857 | 1/1974 | Christopher | 315/396 |
| 3,917,977 | 11/1975 | Izumisawa | 315/395 |
| 3,979,641 | 9/1976 | Arakawa et al. | 315/397 |
| 4,184,105 | 1/1980 | Skelton | 315/397 |

*Primary Examiner*—Malcolm F. Hubler
*Attorney, Agent, or Firm*—Eugene M. Whitacre; Paul J. Rasmussen; Scott J. Stevens

[57] ABSTRACT

A resonant retrace vertical deflection circuit comprises a retrace capacitor which forms a resonant circuit with the yoke vertical deflection windings during retrace of the electron beams. One or more diodes isolate the yoke from the circuit power supply to allow the yoke voltage to increase beyond the level of the supply to provide faster retrace. A second power supply is provided to precharge the retrace capacitor prior to retrace, resulting in a further decrease in retrace time.

4 Claims, 5 Drawing Figures

VERTICAL DEFLECTION CIRCUIT

In a television receiver, the picture is formed by scanning the electron beam or beams horizontally and vertically across the kinescope display screen. Appropriate signals are supplied to the deflection yoke by the deflection circuits to produce the desired movement of the electron beams. The signal applied to the vertical deflection coil causes the beams to be scanned across the display screen from top to bottom. When the beams reach the bottom of the screen, it is necessary to return them to the top to begin another scanning cycle. This beam retrace or flyback must be accomplished during the vertical blanking interval to insure that the vertical retrace will not be visible on the screen. A decrease in retrace time requires the consumption of greater amounts of energy. A large amount of energy is stored in the yoke, due to the inductance of the yoke windings. During retrace, the stored yoke energy is effectively returned to the deflection circuits. A discussion of this can be found in U.S. Pat. No. 3,111,603—Marshall, et al., and 3,784,857—Christopher. It is desirable to recover as much yoke energy as possible, to reduce the requirements on the power supply, and hence, reduce the power dissipation in the deflection circuit output devices.

Prior art vertical retrace circuits used a capacitor coupled with the yoke inductance to form a resonant circuit during a portion of the retrace interval. One or more diodes were used to isolate this resonant circuit from the power supply to allow the yoke voltage to rise above the supply voltage, thereby increasing retrace speed. The time required for the beam to move from the bottom of the screen back to the top is primarily determined by the frequency of the resonant circuit. The time required for the yoke voltage to reach its maximum value also contributes to this retrace time, however, and during the time that the yoke voltage has not reached the value of the supply voltage, energy from the yoke is dissipated through the output devices. In solid state circuits especially, it is desirable that the circuit output devices dissipate as little yoke energy as possible in order to reduce the size and cost of the output devices. Providing a faster rate of increase of the yoke voltage during retrace decreases the retrace time without increasing the power dissipation of the output devices, significantly.

The present invention provides a resonant retrace circuit that allows the yoke voltage to rise above the level of the supply. The retrace capacitor of the resonant circuit is charged during a portion of the trace interval. This "precharging" causes the yoke voltage to increase very rapidly at the beginning of retrace to provide a faster beam retrace without increasing the power dissipation of the circuit output devices.

In the drawing:

FIG. 1 is a schematic diagram of a vertical retrace circuit illustrating the present invention; and FIG. 2(a)-(d) are signal waveforms illustrating the operation of the present invention. Referring to FIG. 1, there is shown a vertical deflection circuit comprising a deflection signal source 10 which provides an output signal to the base of transistor 11. The collector of transistor 11 is connected through a resistor 12 to the base of a transistor 13. The collector of transistor 11 is also connected through the parallel combination of a capacitor 14 and a resistor 15, and through a smoothing resistor 16 to a source of positive potential, designated as terminal V+. The emitter of transistor 11 is connected to the base of transistor 17.

The emitter of transistor 13 is coupled through resistor 16 to the source of positive potential and the collector of transistor 13 is connected to the input of a vertical blanking circuit 20.

The base of transistor 17 is coupled through a resistor 21 to ground and the emitter of transistor 17 is coupled directly to ground. The collector of transistor 17 is coupled back through a high frequency filter capacitor 22 to its own base, through a serially-connected resistor 23 to the cathode of a diode 24. The anode of diode 24 is connected to the base of a transistor 26. The collector of transistor 17 is also connected to the cathode of a diode 27, which has its anode coupled to the emitter of transistor 26. A resistor 30 is connected in parallel with diode 27.

The emitter of transistor 26 is connected directly to terminal 31 of vertical deflection windings 32 and coupled through a capacitor 33 and a resistor 34 to terminal 35 of vertical deflection windings 32. Terminal 35 of windings 32 is coupled through serially-connected resistor 36 and capacitor 37 to ground.

Diode 40 is coupled between the base and emitter of transistor 26, with the cathode of diode 40 toward the base of transistor 26. The base of transistor 26 is also coupled through a resistor 41 to a terminal 42. Terminal 42 is coupled through a capacitor 43 to the emitter of transistor 26. Terminal 42 is also connected to the cathode of a diode 44. The anode of diode 44 is coupled through a resistor 45 and through resistor 16 to the source of positive potential.

The collector of transistor 26 is coupled through a resistor 46, a diode 47, a capacitor 50, and resistor 16 to the source of positive potential. Resistor 46, diode 47 and capacitor 50 are all connected in parallel with the collector of transistor 26, with the cathode of diode 47 connected to the collector. The collector of transistor 26 is also coupled through a resistor 51 to a second source of positive potential, designated as terminal V++. Terminal V++ is at a higher potential than terminal V+. Terminal V+ is also coupled through resistor 16 and an AC bypass capacitor 52 to ground.

Figure 2A:
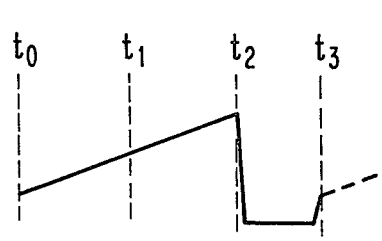

The operation of the circuit will now be described. The deflection signal source 10 supplies a vertical deflection input signal to preamplifier transistor 11. The input signal from source 10, which is generally in the form of a sawtooth voltage waveform as shown in FIG. 2(a), has a frequency of approximately 60 Hz. The first portion of the signal cycle, time $t_0 - t_1$ in FIG. 2(a) provides for beam deflection in the top portion of the television raster, i.e., from the top to approximately the middle of the screen. The second portion of the signal cycle (time $t_1 - t_2$) provides for vertical deflection in the bottom portion of the raster. Each cycle of the deflection signal provides for one vertical trace and one vertical retrace of the electron beams representing one field of video information. The long increasing portion of the waveform in FIG. 2(a) represents the trace segment of the vertical deflection cycle, while the portion of the waveform from time $t_2 - t_3$ represents the retrace segment of the deflection cycle.

Figure 2B:
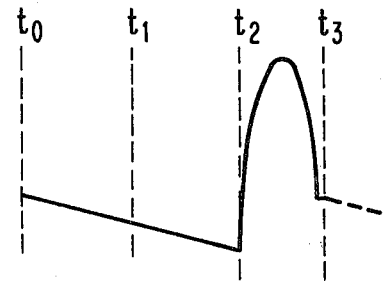
Figure 2C:
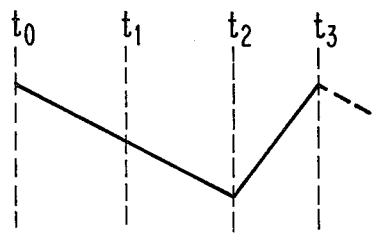

Transistor 11 acts as a preamplifier stage providing current drive to output transistor 17. During the first half of trace ($t_0 - t_1$), output transistor 26 is turned on and conducting heavily while output transistor 17 is only lightly conducting. Transistor 26 draws current from the V+ supply through resistor 16, diode 47, and the vertical windings 32, charging capacitor 37. At the beginning of trace, the emitter voltage of output transistor 26 and hence, the yoke voltage is at a value close to the voltage value of the V+ supply, approximately 26 volts. FIG. 2(b) illustrates the voltage waveform at the emitter of transistor 26. As the value of the sawtooth deflection input signal increases, transistor 17 begins to conduct more heavily, causing transistor 26 base current to be shunted through diode 24 and resistor 23 to the collector of transistor 17. The shunting of base current from transistor 26 causes the emitter voltage of transistor 26 to drop as can be seen in FIG. 2(b). The base current shunted from transistor 26 by transistor 17 will continue to increase until transistor 26 is cut off. When the voltage at the emitter of transistor 26 becomes lower than the voltage across capacitor 37, current flow through vertical windings 32 is reversed, causing current to be drawn out of capacitor 37, thereby discharging it, through diode 27, resistor 30 and the collector-emitter path of transistor 17 to ground. As the yoke current flow through resistor 30 increases, the voltage drop across resistor 30 also increases until diode 27 becomes forward biased. This causes the majority of the yoke current to flow through diode 27. The voltage drop across diode 27 causes the base-emitter junction of transistor 26 to be reverse biased, preventing current from flowing through the collector-emitter path of transistor 26. During the second half of trace, capacitor 43 is charged from the V+ supply along a charging path comprising resistor 16, resistor 45, diode 44, diode 27, resistor 30 and transistor 17 to ground. The energy stored in capacitor 43 is used to supply base drive to transistor 26 during the second half of retrace and the first half of the subsequent trace cycle.

At the end of the trace interval ($t_2$), the input deflection signal sharply decreases, cutting off transistor 17 and initiating retrace. At the time transistor 17 turns off, the reverse-direction current in the yoke is at its maximum value, as can be seen from the yoke current waveform shown in FIG. 2(c). Since it is impossible to stop current flow through an inductor immediately, the current in the yoke continues flowing; however, since transistor 17 is off, the current now flows through diode 40 into the base-collector junction of the top output transistor 26, causing transistor 26 to conduct in the reverse mode (emitter-to-collector). Retrace energy is then stored in capacitor 50. The open condition of diodes 44 and 47 prevents significant retrace current from going into the V+ supply.

The value of the retrace capacitor 50 is chosen so that in combination with the yoke inductance, the resonant frequency is fast enough to allow the beam to be returned to the top of the screen during the allotted vertical blanking interval. If the resonant frequency is too fast, the energy stored in the yoke inductance is not used efficiently, therefore requiring more power from the supply, and if the resonant frequency is too slow, the beam will not return completely to the top of the screen before the blanking interval ends, resulting in the appearance of the retracing beam on the kinescope display screen. During the first half of retrace, diodes 44 and 47 block current flow to the supply, thereby isolating the yoke windings from the supply, and permitting the yoke voltage to increase beyond the level of the supply voltage. If the diodes were not present, yoke current would flow to the supply and the yoke voltage would be clamped to a maximum level equal to the supply voltage thereby limiting the speed at which the yoke current could change. This in turn would require additional time for the beam to be returned to its initial starting position at the top of the television raster, or alternatively, an increase in the supply voltage, which would require higher power-rated transistors. The presence of the isolating diodes allows the yoke current to decrease very rapidly at the beginning of retrace, thereby causing the yoke voltage to increase to a high level since $$V \text{ is equal to } L\frac{dI_y}{dt}, \text{ where } \begin{array}{l} L = \text{vertical winding inductance} \\ I_y = \text{yoke current} \end{array}$$

Diode 40 prevents the base-emitter junction of transistor 17 from breaking down due to the rapid rise in yoke voltage at the beginning of retrace.

The circuit shown in FIG. 1 employs an additional voltage supply V++, which is designed to precharge the retrace capacitor 50 prior to the beginning of retrace. When output transistor 26 is cut off during the second half of trace, voltage source V++ begins to charge retrace capacitor 50, raising the collector voltage of transistor 26 to a level above the supply V+. At the beginning of retrace, current flows from vertical yoke windings 32 through transistor 26 and further charges capacitor 50. Because of the precharging of capacitor 50 to a higher voltage level, the energy stored in yoke windings 32 is quickly transferred to energy stored as charge in capacitor 50. The rapid transfer of the energy stored in yoke windings 32 causes the yoke current to decrease very rapidly.

Figure 2D:
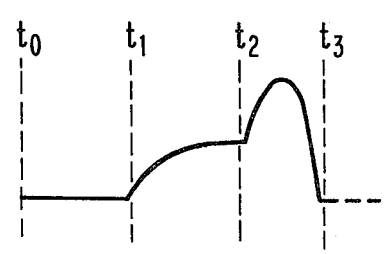

As the current flowing through the yoke and into capacitor 50 decreases towards zero, the beam is moved back toward the center of the picture tube. When the current flowing in this direction reaches zero (the beam reaches the center of the picture) the top output transistor 26 remains turned on due to the stored charge in capacitor 43. Transistor 26 now conducts the energy stored in capacitor 50 back into the vertical yoke windings 32 to move the beam to the top of the picture tube. FIG. 2(d) shows the voltage across capacitor 50 during the deflection cycle. The voltage across capacitor 50 decreases during discharge, until diode 47 begins to conduct again, clamping the collector of transistor 26 to the voltage level of supply V+ and maintaining the yoke voltage at the level of supply V+ during the remaining portion of the vertical blanking interval. At the end of the second half of vertical retrace, the current flowing through transistor 26 into the vertical yoke windings 32 is now maximum. At this point, bottom output transistor 17 is again turned on by the input deflection signal and begins shunting away base current from transistor 26 through diode 24. Transistor 17 will continue turning on harder shunting more base current away from transistor 26, thus pulling the beam down toward the center of the picture tube. This begins the first half of the normal vertical scan cycle. Diodes 44 and 47 prevent current from the first half of retrace from being dumped back into the V+ supply line, forcing the retrace energy to be stored in capacitor 50.

It is desirable to provide a signal which sharply delineates between the trace and retrace portion of the vertical deflection signal that can be used as a vertical blanking pulse. The circuit in FIG. 1 provides such a vertical blanking pulse from the collector of transistor 13. The pulse is generated in the following manner. During the trace portion of the vertical deflection cycle, transistor 11 as previously described acts as a preamplifier or current drive for output transistor 17. During trace, therefore, current flows through transistor 11 and the base-emitting junction of transistor 13, causing transistor 13 to be turned on, placing the V+ supply voltage at the collector of transistor 13. During retrace, however no current flows through transistor 11 and the base-emitter junction of transistor 13 allowing the voltage at the collector to fall to ground reference. This provides a negative pulse during the vertical blanking interval which is applied to the vertical blanking circuit 20. The rapid switching of transistors 11 and 13 provide a well-defined pulse. Resistor 15 and capacitor 14 provide biasing for transistor 13 and also provide a low-pass filter which eliminates any horizontal frequency interference from being introduced into the blanking signal.

The component values of the circuit of FIG. 1 as as follows:

| | |
|---|---|
| Resistor 12 | 1000 Ω |
| Resistor 15 | 10 KΩ |
| Resistor 16 | 4.7 Ω |
| Resistor 21 | 680 Ω |
| Resistor 23 | 10 Ω |
| Resistor 30 | 10 Ω |
| Resistor 34 | 68 Ω |
| Resistor 36 | 1.8 Ω |
| Resistor 41 | 750 Ω |
| Resistor 45 | 10 Ω |
| Resistor 46 | 15 KΩ |
| Resistor 51 | 15 KΩ |
| Capacitor 14 | .022 μf |
| Capacitor 22 | 470 pf |
| Capacitor 33 | .033 μf |
| Capacitor 37 | 820 μf |
| Capacitor 43 | 10 μf |
| Capacitor 50 | 3.3 μf |
| Capacitor 52 | 820 μf |
| V+ Supply | 26 volts |
| V++ Supply | 120 volts |

I claim:

1. A resonant retrace vertical deflection circuit for a television receiver comprising:
   a source of vertical deflection signals;
   a yoke coupled to said signal source for providing vertical deflection of an electron beam in accordance with a deflection cycle having trace and retrace intervals;
   a first source of potential;
   means for utilizing a diode to complete a path for current flow from said first potential source to said yoke during a given portion of said trace interval and to disrupt said path during the remainder of said trace interval and during at least a major portion of said retrace interval;
   a capacitor coupled for resonating with said yoke during said retrace interval portion;
   a second source of potential, providing a potential of greater magnitude than the potential provided by said first source; and
   means including first and second impedance means respectively coupled to said first and second sources, and to said capacitor for coupling a portion of the potential of said second source to said capacitor for charging said capacitor during said remainder of said trace interval, said portion of said second source potential determined by the ratio of said first and second impedance means.

2. The resonant retrace vertical deflection circuit defined in claim 1, wherein the magnitude of the potential provided by said first source of potential is of the order of 26 volts and the magnitude of the potential provided by said second source of potential is of the order of 120 volts.

3. The resonant retrace vertical deflection circuit defined in claim 1, wherein the coupling of said yoke to said signal source is effected by means comprising:
   an output terminal, said yoke being coupled between said output terminal and a point of reference potential;
   a first transistor incorporating base, emitter and collector electrodes, said emitter electrode being connected to a point of reference potential, and said collector electrode being coupled to said output terminal;
   a second transistor, incorporating base, emitter and collector electrodes, said emitter electrode being coupled to said output terminal, said collector electrode being coupled via the parallel combination of said resonating capacitor and said diode to said first source of potential, and said base electrode being coupled to said first source of potential and to said collector electrode of said first transistor; and
   a third transistor, incorporating base, emitter and collector electrodes, said emitter electrode being coupled to said base electrode of said first transistor, said collector electrode being coupled to said first source of potential, and said base electrode being coupled to said source of vertical deflection signals in such manner as to be rendered nonconductive during said retrace interval.

4. The resonant retrace vertical deflection circuit defined in claim 3, further comprising:
   a vertical blanking circuit, responsive to an input signal, for blanking said electron beam; and
   a fourth transistor of a conductivity type opposite to that of said third transistor and incorporating base, emitter and collector electrodes, said base electrode coupled to said collector electrode of said third transistor, said emitter electrode coupled to said first source of potential, and said collector electrode coupled to said vertical blanking circuit for providing an input signal to said vertical blanking circuit when said third transistor is nonconductive.

* * * * *